(12) United States Patent  
Christoph et al.

(10) Patent No.: US 8,885,353 B2  
(45) Date of Patent: Nov. 11, 2014

(54) ELECTRICAL ASSEMBLY FOR A MOTOR VEHICLE, SUITABLE FOR CONTACTING WITH A CONNECTOR

(75) Inventors: Markus Christoph, Regensburg (DE); Christian Plankl, Regensburg (DE); Engelbert Woerle, Aichach (DE); Joachim Baumgartner, Pielenhofen (DE)

(73) Assignee: Continental Automotive GmbH, Hannover (DE)

( * ) Notice: Subject to any disclaimer, the term of this patent is extended or adjusted under 35 U.S.C. 154(b) by 126 days.

(21) Appl. No.: 13/805,856

(22) PCT Filed: Jun. 22, 2011

(86) PCT No.: PCT/DE2011/001450  
§ 371 (c)(1),  
(2), (4) Date: Dec. 20, 2012

(87) PCT Pub. No.: WO2012/010152  
PCT Pub. Date: Jan. 26, 2012

(65) Prior Publication Data  
US 2013/0100620 A1   Apr. 25, 2013

(30) Foreign Application Priority Data

Jun. 25, 2010   (DE) .......................... 10 2010 025 086

(51) Int. Cl.
| | | |
|---|---|---|
| H05K 5/00 | (2006.01) | |
| H05K 7/00 | (2006.01) | |
| B60R 16/023 | (2006.01) | |
| H01R 12/72 | (2011.01) | |
| H05K 5/06 | (2006.01) | |
| H05K 13/04 | (2006.01) | |
| H01R 13/516 | (2006.01) | |
| H01R 13/639 | (2006.01) | |
| H05K 1/11 | (2006.01) | |

(52) U.S. Cl.  
CPC .............. *H05K 7/00* (2013.01); *B60R 16/0239* (2013.01); *H01R 12/721* (2013.01); *H05K 5/0069* (2013.01); *H05K 5/069* (2013.01); *H01R 12/72* (2013.01); *H05K 13/04* (2013.01); *H01R 13/516* (2013.01); *H01R 13/639* (2013.01); *H05K 1/117* (2013.01)  
USPC ............ 361/752; 361/748; 361/736; 439/283

(58) Field of Classification Search  
USPC .......................... 361/752, 748, 736; 439/283  
See application file for complete search history.

(56) References Cited

U.S. PATENT DOCUMENTS

| | | | |
|---|---|---|---|
| 4,596,436 A | 6/1986 | Kraemer et al. | |
| 6,233,153 B1 | 5/2001 | Baur et al. | |

(Continued)

FOREIGN PATENT DOCUMENTS

| | | |
|---|---|---|
| DE | 36 09 684 | 9/1986 |
| DE | 40 05 113 | 8/1991 |

(Continued)

OTHER PUBLICATIONS

International Search Report of the International Searching Authority for International Application PCT/DE2011/001450, mailed Mar. 12, 2012, 3 pages, European Patent Office, HV Rijswijk, Netherlands.

(Continued)

*Primary Examiner* — Andargie M Aychillhum  
(74) *Attorney, Agent, or Firm* — W. F. Fasse

(57) ABSTRACT

An electrical assembly for a motor vehicle is configured to contact a connector. Contact surfaces are provided on a circuit board of the assembly. The connector has contact elements for contacting the contact surfaces. A housing of the assembly has an inner chamber and a contacting chamber directed toward the connector area, with the inner wall therebetween to separate the chambers. The circuit board including the electrical components is arranged in the inner chamber and only a contacting area with the contact surfaces protrudes through the inner wall into the contacting chamber.

17 Claims, 8 Drawing Sheets

(56) References Cited

U.S. PATENT DOCUMENTS

| | | |
|---|---|---|
| 6,445,568 B1 | 9/2002 | Baur et al. |
| 6,606,252 B1 * | 8/2003 | Snider .......................... 361/777 |
| 6,781,847 B2 * | 8/2004 | Jakob et al. ................... 361/752 |
| 7,885,080 B2 | 2/2011 | Janisch et al. |

FOREIGN PATENT DOCUMENTS

| | | |
|---|---|---|
| DE | 195 33 723 | 3/1997 |
| DE | 102004002562 | 8/2005 |
| DE | 102005003448 | 8/2006 |
| EP | 0 712 265 | 5/1996 |
| EP | 1 104 228 | 5/2001 |

OTHER PUBLICATIONS

PCT International Preliminary Report on Patentability including English Translation of PCT Written Opinion of the International Searching Authority for International Application PCT/DE2011/001450, issued Dec. 28, 2012, 9 pages, International Bureau of WIPO, Geneva, Switzerland.

German Search Report for German Application No. 10 2010 025 086.4, dated Jun. 20, 2011, 5 pages, Muenchen, Germany, with English translation, 5 pages.

* cited by examiner

Details in Fig. 6

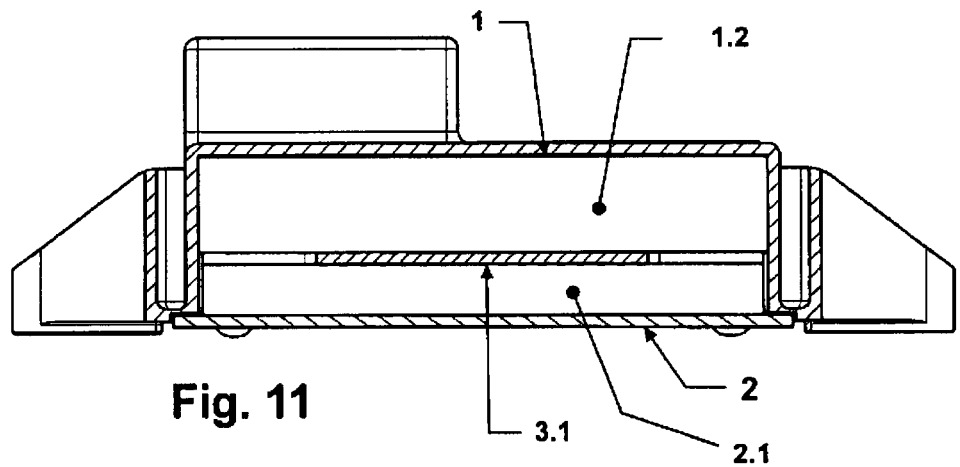
Fig. 11
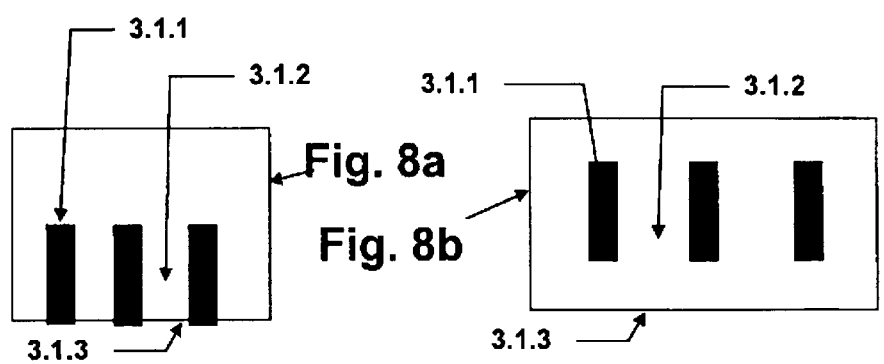
Fig. 8a
Fig. 8b

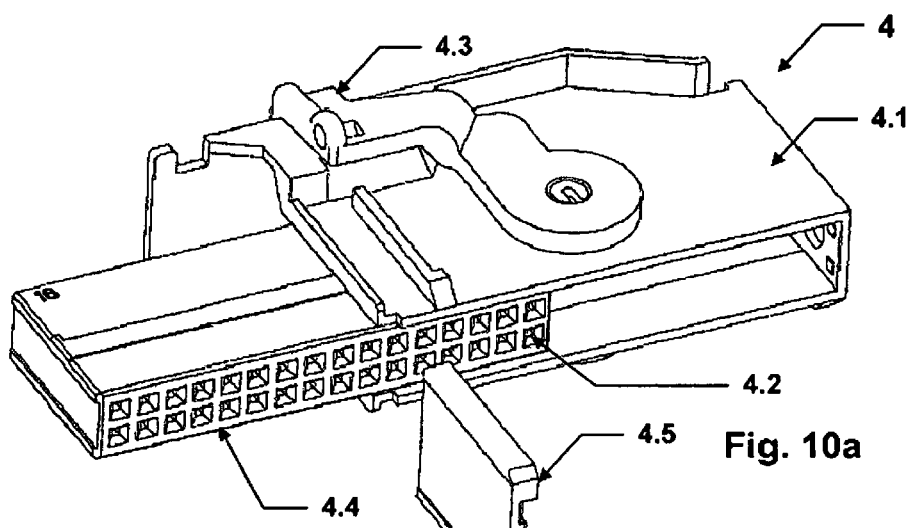
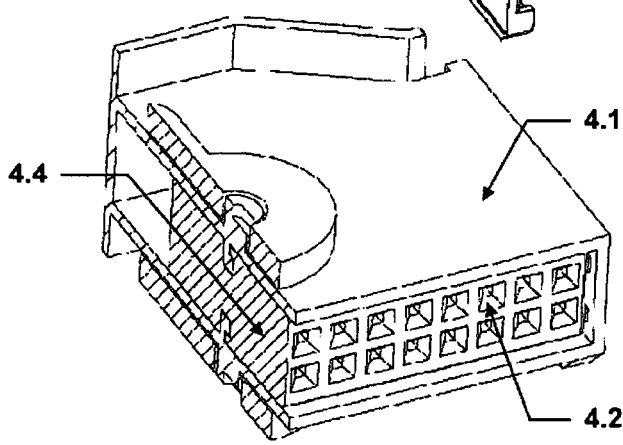
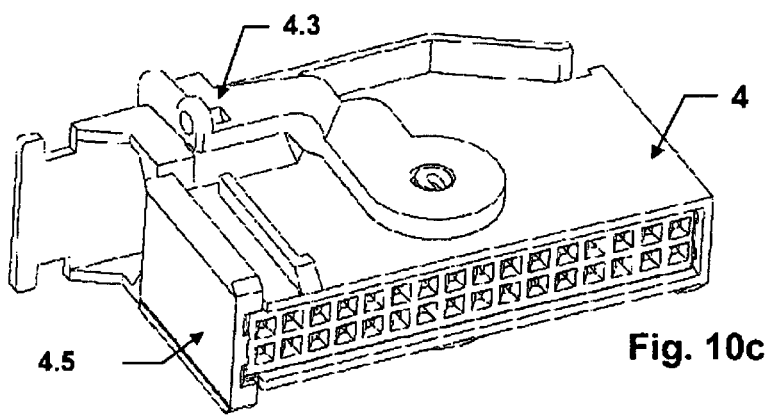
Fig. 10a
Fig. 10b
Fig. 10c

ELECTRICAL ASSEMBLY FOR A MOTOR VEHICLE, SUITABLE FOR CONTACTING WITH A CONNECTOR

FIELD OF THE INVENTION

The invention relates to an electrical assembly for a motor vehicle, suitable for contacting with a connector.

BACKGROUND INFORMATION

Especially for installation in motor vehicles, the electrical assembly must be moisture-proof, at least after the connector is plugged in, in order to be protected from the environment, in particular moisture and dirt. For this purpose, connector pins have increasingly been used, which are injection-moulded as insertion parts of the plastic material of the connector area and pressed into the circuit board or soldered to the circuit board. For example, DE 10 2004 002562 A1 or EP 712 265 D1 show such an assembly.

In addition, the edge connector principle is known, in particular from computer technology, for exchangeable plug-in cards and memory cards; here, contact surfaces suitable for making electrical contact are formed on a carrier, for example a circuit board, and are usually contacted by means of spring contacts. DE 10 2005 0 03448 A1 also suggests said edge connection for a control unit that is intended for a motor vehicle and comprises a circuit board arranged outside a housing; in this configuration, only individual electrical components arranged on the circuit board, rather than the circuit board itself, are protected from the environment by means of a housing unless the housing is also sealed in the connector area, at least by plugging in the connector. This considerably increases the cost of the circuit board as well as of production and is therefore not suitable for cost-efficient mass production.

SUMMARY OF THE INVENTION

An object of an embodiment of the present invention is therefore to provide an improved assembly and a method for making electrical contact between an electrical assembly for a motor vehicle and at least one connector, as well as a preferred configuration of a suitable connector.

The aforesaid object is achieved by means of the features set out in the independent claims. Advantageous further developments of the invention can be seen from the sub-claims, wherein combinations and further developments of individual features with each other are also possible.

An underlying idea of an embodiment of the invention is that the housing of the assembly comprises an inner chamber and a contacting chamber that is directed toward the connector area, wherein at least one inner wall is provided between the inner chamber and the contacting chamber in order to separate said chambers and the circuit board including the electrical components is arranged in the inner chamber and only the contacting area formed so as to extend from the circuit board protrudes through the inner wall into the contacting chamber. As a result, the housing of the assembly is configured in such a manner that the housing of the assembly entirely encloses the circuit board outside the contact area even before the connector is plugged in, i.e. the essential part of the circuit board including the electrical components thereon is protected better even before the connector is plugged in and the connector must, in addition, only seal the contact area including the contact surfaces.

BRIEF DESCRIPTION OF THE DRAWINGS

The invention will now be explained in more detail by means of an exemplary embodiment and with reference to the figures. Below, the same reference numerals can be used to identify functionally equivalent and/or identical elements.

In the figures,

FIG. 8a shows an edge connector whose contact surfaces extend up to the edge of the contact area FIG. 8b shows an edge connector whose contact surfaces are placed further back from the edge FIG. 10 shows a configuration of the connector with an alternative carrier for other contact elements FIG. 11 is another section of the assembly in the area of the contacting chamber providing a view at the inner wall.

DETAILED DESCRIPTION OF EXAMPLE EMBODIMENTS OF THE INVENTION

Figure 1:
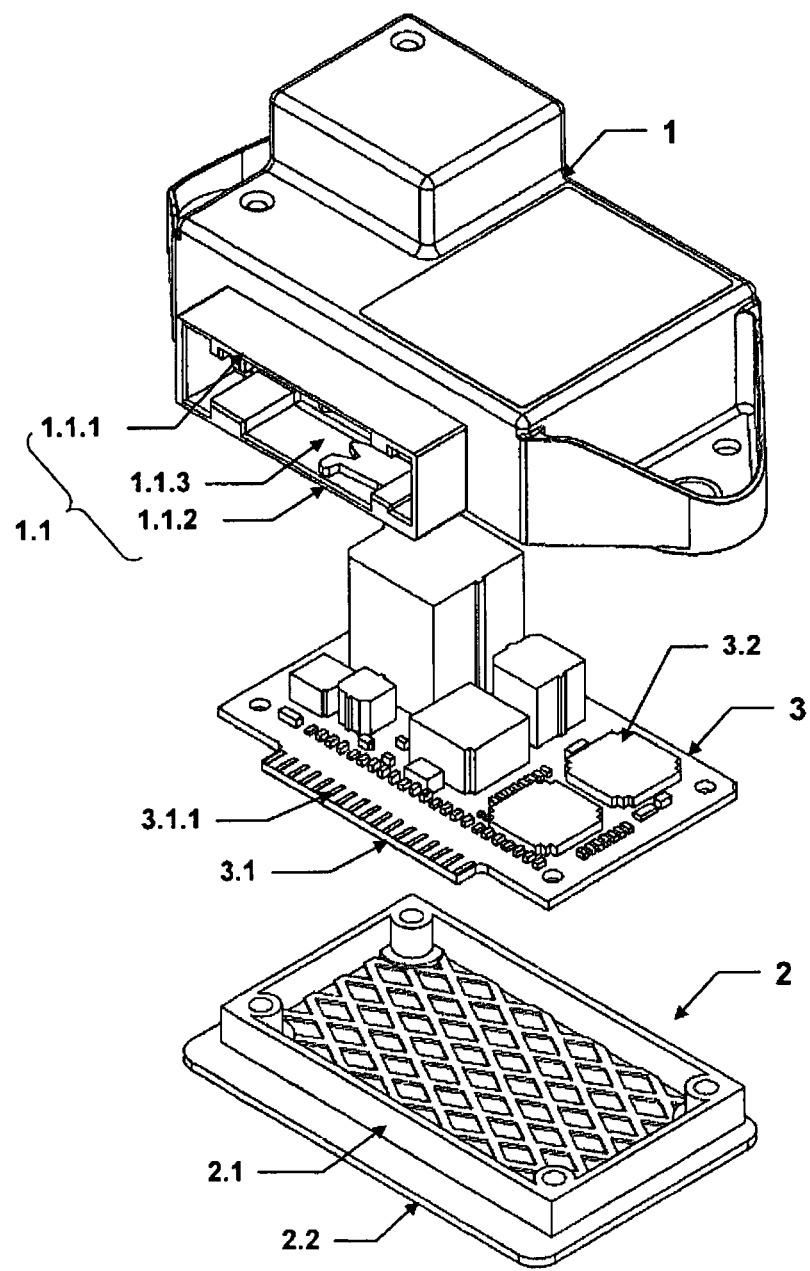
FIG. 1: shows components of the assembly prior to mounting

FIG. 1 is an exploded diagram showing the components of the assembly prior to mounting. The assembly consists of a housing comprising an upper housing part 1 and a lower housing part 2; the terms "upper" and "lower" are used in connection with the description according to the view shown in FIG. 1 and it is not essential to the invention which housing part is in fact arranged on top or below the other and, in particular, where the connector area is formed. In this aspect, the exemplary embodiments shown and described herein are merely exemplary and do not limit the invention.

In this exemplary embodiment, the connector area 1.1 is located on the upper housing part 1. The lower housing part 2 is designed as a lid comprising an inner wall 2.1 that serves to form the contacting chamber 1.3, which is placed further back (cf. following figures), and a projection 2.2 that serves to close the contacting chamber 1.3 in the direction of the bottom side of the housing. The circuit board 3 is arranged between the upper housing part 1 and the lower housing part 2, wherein a tongue-shaped contacting area 3.1 is formed on the circuit board, enabling a spatial separation of the contacting area from the other parts of the circuit board 3 and the electrical components 3.2 arranged thereon.

Figure 2:
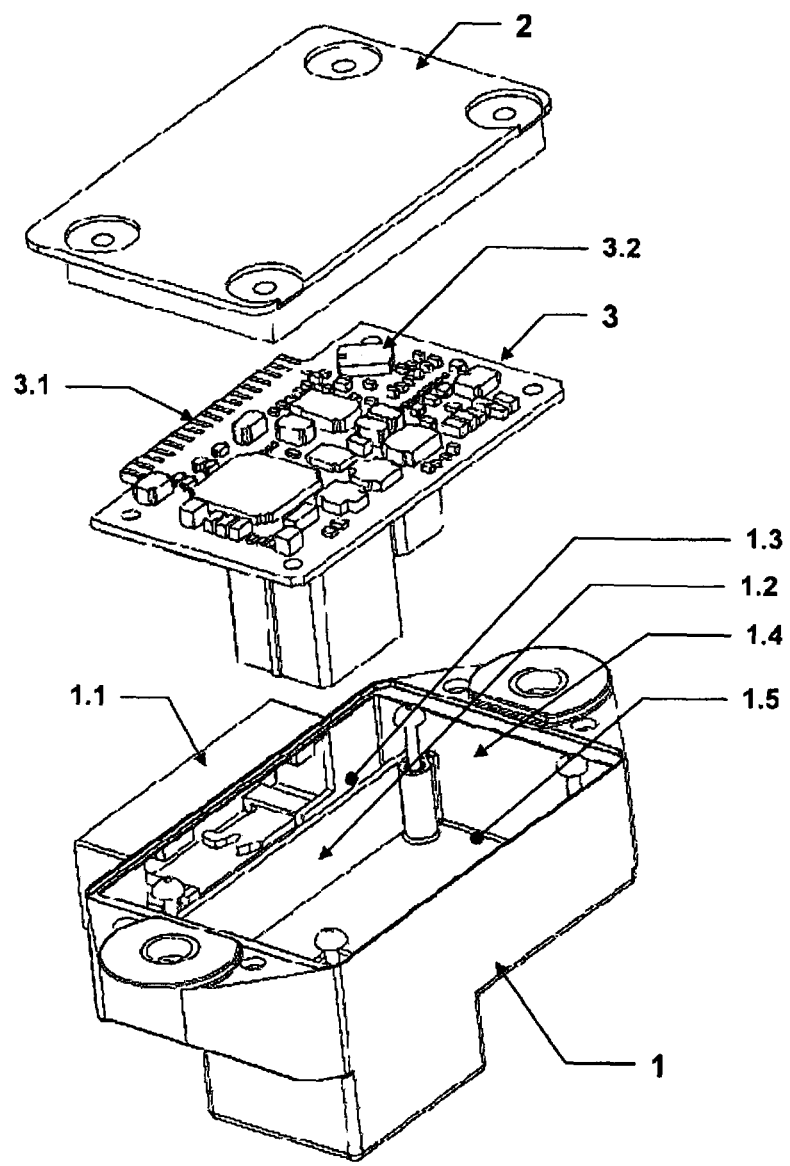
FIG. 2: shows components of the assembly according to FIG. 1 seen from the opposite direction

FIG. 2 shows the components of the assembly according to FIG. 1 seen from the opposite direction. In particular, the figure clearly shows the inner wall 1.2 in the upper housing part 1 (located below in FIG. 2!). Said inner wall 1.2 divides the upper housing part 1 into an inner chamber 1.5 and the contacting chamber 1.3. In addition, it can be seen in FIG. 2 that the opening 1.4 of the upper housing part 1 is dimensioned in such a manner that the circuit board 3, including the contact area 3.1 located opposite, can be directly inserted into the upper housing part 1 at right angles or the upper housing part 1 can be placed directly on top since the contacting area 3.1 is arranged in the contacting chamber 1.3, i.e. placed further back from the outer connector area 1.1.

Figure 3:
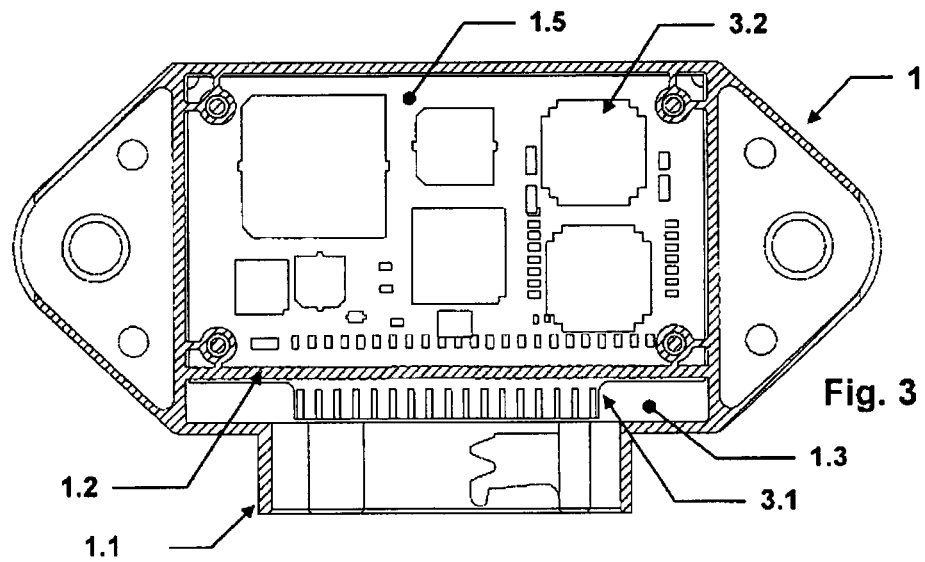
FIG. 3: is a horizontal section of the mounted assembly
Figure 4:
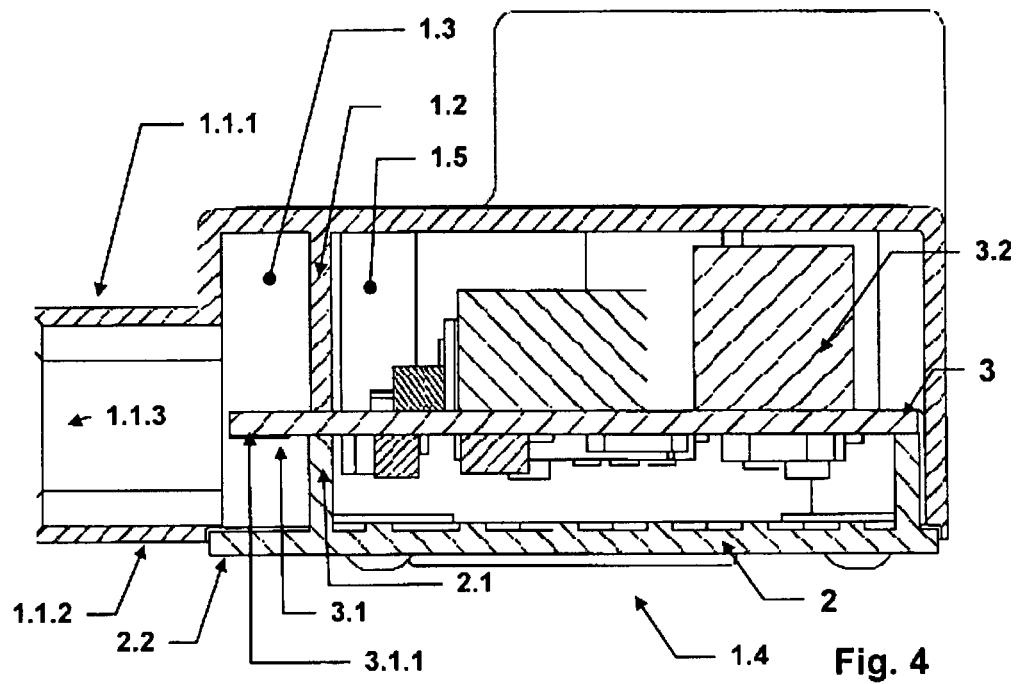
FIG. 4 is a vertical section of the mounted assembly

Said division can be seen even better in the sectional views of the mounted assembly shown in FIG. 3 and FIG. 4. FIG. 3 shows a horizontal section of the assembly once it has been mounted to the circuit board 3. As can be seen most clearly in the view shown in FIG. 3, the upper housing part 1 is divided so as to form the inner chamber 1.5 where the electronic components 3.2 are always separated and protected from the environment by the inner wall 1.2, even when the connector is not plugged in. In addition, FIG. 11 also shows very clearly that both inner walls 1.2 and 2.1 extend up to the circuit board 3 enclosed between them, thus separating the contacting chamber from the inner chamber. The inner walls 2.1 and 1.2 of the upper housing part 1 and the lower housing part 2 are arranged in the same plane in the preferred configuration, as can best be seen in FIGS. 5 and 6. As a result, the walls 2.1 and 1.2 are both supported by the circuit board 3 in opposite directions while avoiding a bending load on the circuit board 3.

Preferably, the inner walls 2.1 and 1.2 also form a unit in terms of material with the plastic material of the upper housing part 1 and the lower housing part 2, respectively; they are preferably formed integrally therewith so as to extend therefrom or made by two-component moulding, i.e. from another plastic material but bonded thereto during the injection and pressing process.

In a particularly preferred further development, each of the edges of the inner walls 2.1 and 1.2 that are supported by the circuit board can also be provided with a sealing element. In another configuration, said sealing elements can also have an excess dimension in the non-mounted state, which will be reduced when the housing is mounted and the two housing parts are pressed against each other and against the circuit board arranged between them, thus achieving a particularly tight seal.

But even if a small air gap remains between the circuit board and the inner walls of the housing parts, the electronic components in the inner chamber will be protected to a certain extent that is sufficient for storage of such assemblies prior to their installation by the vehicle manufacturer or in a garage. Of course, protection can be much improved by means of the sealing elements described above, though usually the housing need not be completely pressure-sealed since such housings normally have a pressure compensation element inside so that no excessive pressure differences have to be expected.

Only the contacting area 3.1 of the circuit board 3 is arranged in the contacting chamber 1.3 and may be exposed to the environment through the front opening 1.1.3 of the connector area 1.1 when the connector is not plugged in.

The vertical section shown in FIG. 4 is a supplementary illustration showing very clearly the interaction of the inner wall 1.2 of the upper housing part 1 with the side wall 2.1 of the lower housing part 2, between which the circuit board 3 is protected from the environment in the inner chamber 1.5 once the assembly has been mounted.

In addition, it can clearly be seen that the opening 1.4 on the bottom side of the upper housing part is dimensioned in such a manner that the circuit board 3 can be directly inserted at right angles. On the other hand, it can clearly be seen that the opening 1.4 is completely closed by the lower housing part 2, in particular the projection 2.2, even in the area of the contacting chamber 1.3.

Figure 5:
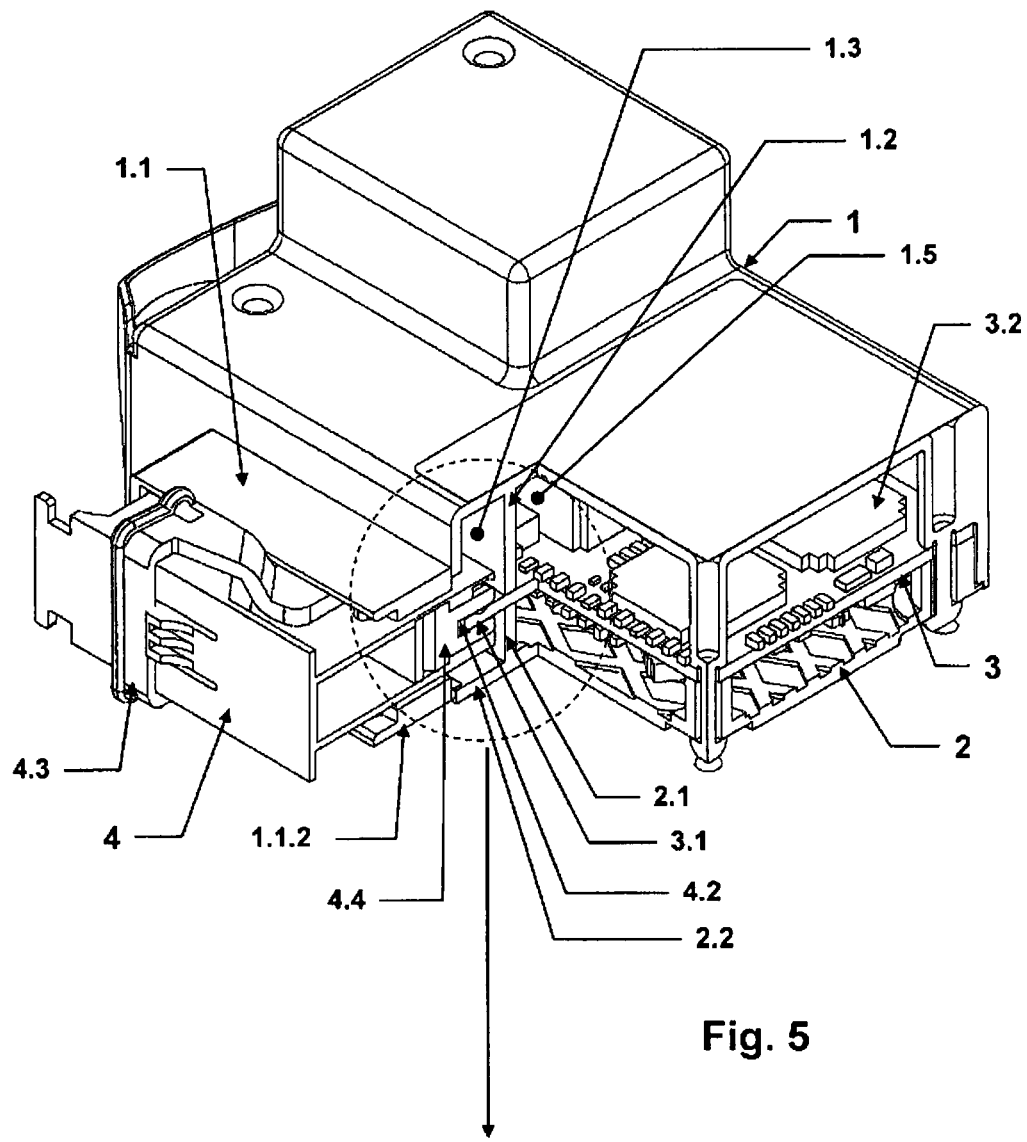
FIG. 5 shows the assembly and the plugged-in connector, partly in section
Figure 6:
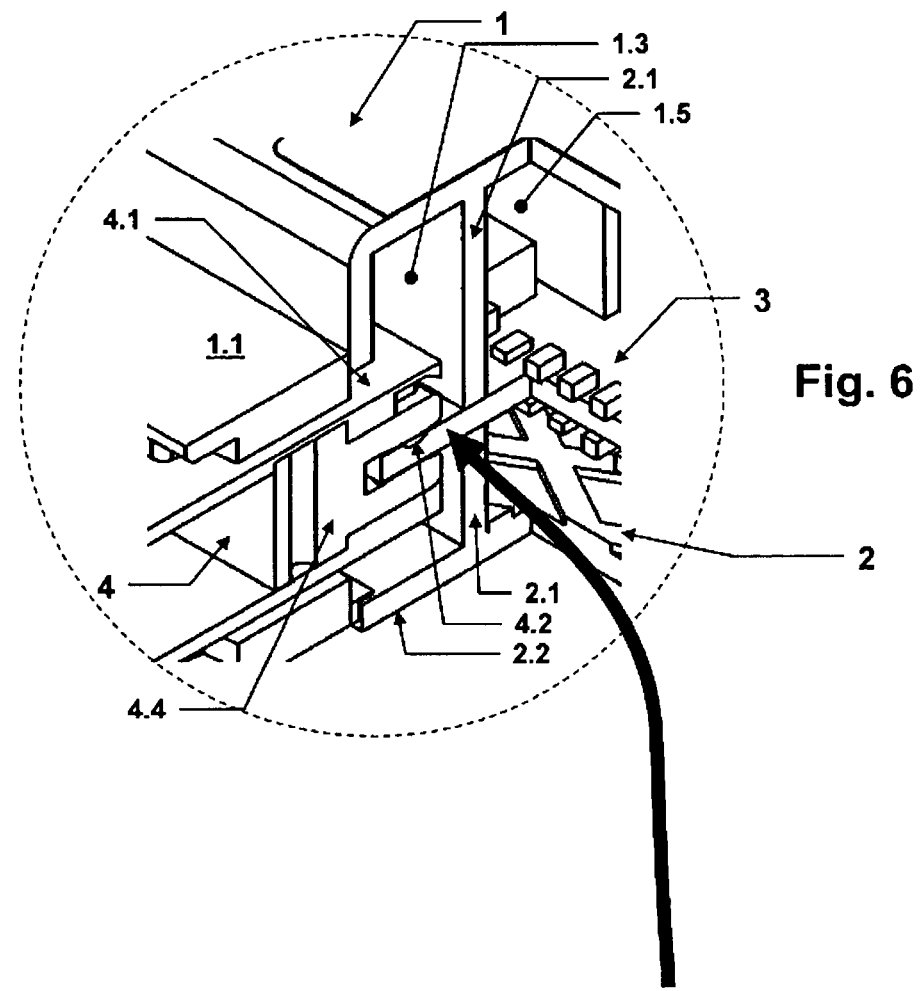
FIG. 6 shows a detail from FIG. 5

FIG. 5 shows the assembly and the plugged-in connector 4, partly in section, and FIG. 6 is an enlarged view showing the area of electrical contact marked by the dotted line in FIG. 5; reference will mainly be made to this figure. Again, these figures show the interaction of the inner wall 1.2 of the upper housing part 1 with the side wall 2.1 on the lower housing part 2 to form the inner chamber 1.5 for the electrical components 3.2 on the circuit board 3 and the separate contacting chamber 1.3. It can clearly be seen how the carrier 4.4 of the connector 4 encloses the contacting area 3.1 of the circuit board 3 on both sides while inside the contact elements 4.2 of the connector 4 are in electrical contact with the contact surfaces 3.1.1, as can be seen even better in FIG. 7.

Figure 7:
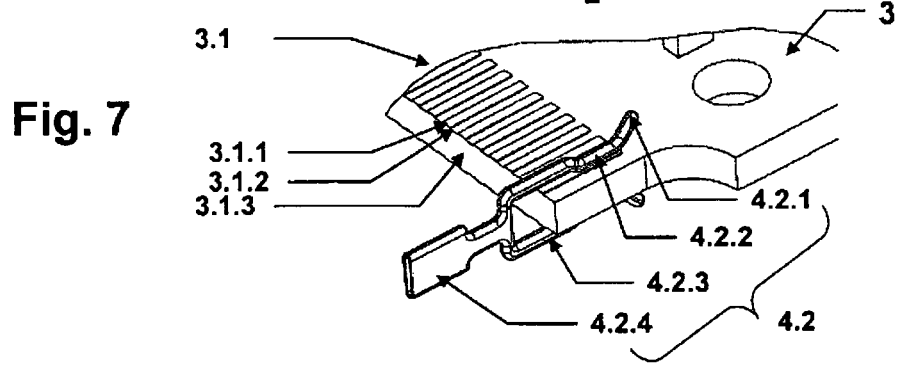
FIG. 7 shows a detailed view of the area where contact is made while omitting the other parts of the connector

FIG. 7 shows only the circuit board 3 including the contact surfaces 3.1.1 and the insulating gaps 3.1.2 between them and a preferred configuration of a contact element 4.2 while omitting all housings of the assembly as well as the connector, so that the way electrical contact is actually made can be seen.

A connector preferably comprises a plurality of identical contact elements 4.2. Each contact element 4.2 comprises a resilient arm including an insertion area 4.2.1, which is slightly wider than the thickness of the circuit board 3 and opens so as to extend away from the circuit board, a contact area 4.2.2 of the resilient arm, which is narrower than said insertion area and possibly with light press fit on the circuit board 3, and preferably an opposite arm 4.2.3 for exerting counterpressure, wherein the opposite arm 4.2.3 can be rigid or be a resilient arm of identical design.

In addition, each contact element 4.2 has a connection zone 4.2.4 where the contact element 4.2 is connected to electrical connection cables (not shown in detail) in the connector 4.

FIGS. 8a and 8b outline different configurations of the edge connection, which—as mentioned above—is preferred for the invention, wherein in FIG. 8a the contact surfaces 3.1.1 extend up to the edge 3.1.3 of the contact area 3.1, possibly even continuing around said edge 3.1.3 and continuously electrically connected down to the bottom side of the circuit board 3. As an alternative, the contact surfaces 3.1.1 can of course be arranged at a certain distance from the edge 3.1.3.

Figure 9A:
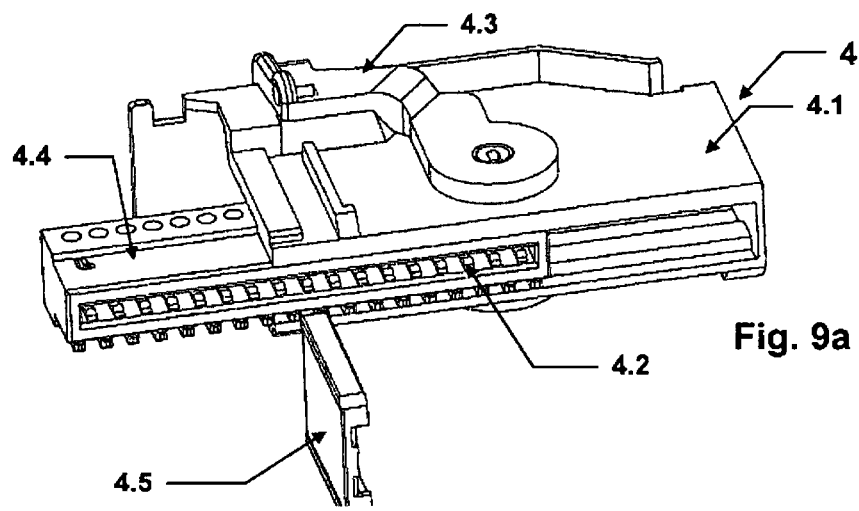
FIG. 9 shows a configuration of the connector where the carrier of the contact elements can be inserted
Figure 9B:
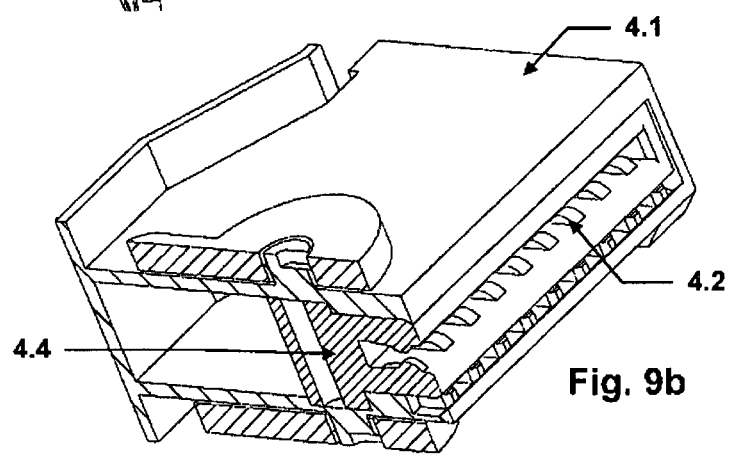
Figure 9C:
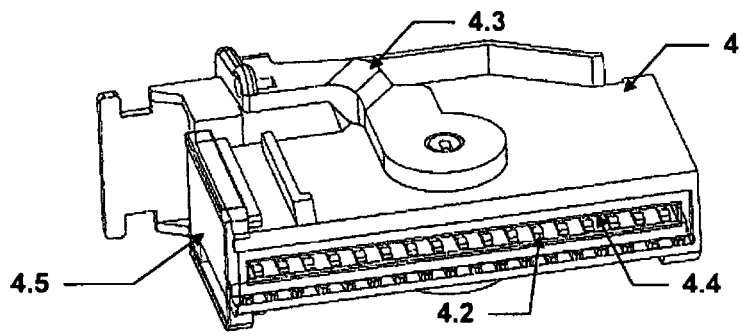

FIGS. 9a, 9b and 9c show a particularly preferred configuration of the connector 4. The connector 4 consists of an outer connector frame 4.1 formed in accordance with the connector area 1.1 and into which a separate carrier 4.4 including the contact elements 4.2 can preferably be inserted. The carrier 4.4 can be locked in the connector frame 4.1 by means of a closure plate 4.5. The particular advantage of such a connector with a separate carrier 4.4 will be seen when looking at FIG. 10 as well, where an alternative carrier 4.4 including conventional contacts for pin contacts is inserted. This means, one connector 4 and exchangeable carriers 4.4 can be used to connect different assemblies.

In addition, a locking element 4.3 is preferably formed on the connector 4, which locking element additionally presses the connector 4 against the housing and locks it to the housing once it has been plugged in. As a result, the desired moisture-proof assembly-connector unit will remain unaffected by vibrations during driving when such an assembly is used in a motor vehicle, for example as a control unit for engine controls, ABS controls or air bag controls.

List Of Reference Numerals

1 Upper housing part
1.1 Connector area on the upper housing part
1.1.1 Top side of the connector area
1.1.2 Bottom side of the connector area
1.1.3 Open front area of the connector area
1.2 Inner wall, provided to form a contacting chamber 1.3 that is placed further back
1.3 Contacting chamber, placed further back from the connector area 1.4 Opening of the upper housing part, provided to insert the circuit board
1.5 Inner chamber
2 Lower housing part
2.1 Inner wall, provided to form the contacting chamber 1.3 that is placed further back
2.2 Projection on the lower housing part, provided to close the opening 1.4
3 Circuit board
3.1 Contacting area
3.1.1 Contact surface
3.1.2 Insulating gap between the individual contact surfaces
3.1.3 Front edge of the contacting area
3.2 Components on the circuit board
4 Connector
4.1 Connector frame
4.2 Contact elements
4.2.1 Insertion area of the resilient arm of the contact element
4.2.2 Contact area of the resilient arm of the contact element
4.2.3 Opposite arm of the contact element, provided to exert counterpressure
4.2.4 Connection zone of the contact element
4.3 Locking element on the connector
4.4 Insertable carrier of the contact elements
4.5 Closure plate, provided to lock the carrier 4.4 in the connector frame

The invention claimed is:

1. An electrical assembly adapted to be connected with an electrical connector, said electrical assembly comprising:
a housing,
a circuit board,
electrical components on a circuitry area of said circuit board,
electrical contact elements on a contact area of said circuit board, and
conducting tracks electrically connecting said electrical components and said contact elements on said circuit board,
wherein:
said housing comprises an upper housing part including an upper inner wall part, and a lower housing part including a lower inner wall part,
said upper and lower housing parts are joined together and define therebetween a circuitry chamber and a contact chamber, whereby said upper and lower inner wall parts together form an inner wall that separates said contact chamber from said circuitry chamber,
said circuit board is arranged with said circuitry area thereof and said electrical components received in said circuitry chamber, and said contact area thereof and said contact elements received in said contact chamber,
said circuit board protrudes through said inner wall between said upper and lower inner wall parts, from said circuitry chamber to said contact chamber, and
said housing has an opening which communicates externally into said contact chamber and through which said contact elements are accessible for being connected with the electrical connector.

2. The electrical assembly according to claim 1, wherein said upper and lower inner wall parts are arranged on a single common plane.

3. The electrical assembly according to claim 1, wherein said upper and lower inner wall parts are formed integrally with and connected to a plastic material of said upper and lower housing parts respectively so as to extend therefrom.

4. The electrical assembly according to claim 1, wherein said housing is shaped such that the connector can be plugged through said opening into said contact chamber to form a moisture-proof assembly-connector unit when the connector is plugged in.

5. The electrical assembly according to claim 1, wherein said lower housing part and said upper housing part are respectively configured as a housing tray and a housing lid, a peripheral connector collar is provided on said housing tray and forms said contact chamber, and said housing tray has an opening that forms said circuitry chamber and has a size corresponding at least to a surface area of said circuit board, which opening can be completely closed by said housing lid.

6. A combination including a connector and an electrical assembly for a motor vehicle, wherein the electrical assembly is suitable for contacting with the electrical connector, wherein the electrical assembly comprises:
an assembly housing,
a circuit board including electrical components and conducting tracks, and
first contact elements that are accessible to the connector and that comprise contact surfaces forming edge connectors on a contact area of the circuit board connected with said conducting tracks,
wherein:
the assembly housing forms an inner chamber and a contacting chamber,
the assembly housing comprises an upper housing part, a lower housing part, and upper and lower inner walls respectively provided on the upper and lower housing parts,
the circuit board is fixed between the upper housing part and the lower housing part,
the upper and lower inner walls extend to the circuit board, jointly forming an inner wall that separates the contacting chamber from the inner chamber, and
a portion of the circuit board including the electrical components is arranged in the inner chamber and only the contact area of the circuit board protrudes through the inner wall into the contacting chamber,
the connector comprises a connector housing and second contact elements, which are aligned and shaped in accordance with the first contact elements of the assembly so as to contact the first contact elements, and
the connector housing is shaped in accordance with the assembly housing, so that a moisture-proof assembly-connector unit is obtained when the connector is plugged in.

7. The combination according to claim 6, characterized in that the upper and lower inner walls are arranged in the same plane.

8. The combination according to claim 6, characterized in that the upper and lower inner walls are formed integrally with and connected to a plastic material of the upper housing part and the lower housing part respectively so as to extend therefrom.

9. The combination according to claim 6, characterized in that
the contact area extends to the outside of the assembly housing or can be contacted from outside through a recess of the assembly housing, and
the assembly housing entirely encloses the circuit board outside the contact area.

10. The combination according to claim 6, characterized in that the lower housing part and the upper housing part are respectively configured as a housing tray and a housing lid, wherein a peripheral connector collar that serves to plug in the connector is provided on the housing tray, and the housing tray has an opening corresponding at least to a surface area of the circuit board, which opening can be completely closed by the housing lid.

11. The combination according to claim 6, further including the motor vehicle, wherein the connector and the electrical assembly are mounted in the motor vehicle.

12. A method of manufacturing the electrical assembly of the combination according to claim 6, wherein the circuit board is fixed between the upper housing part and the lower housing part when the housing is closed, wherein both inner walls extend up to the circuit board, jointly forming the inner wall that separates the contacting chamber from the inner chamber.

13. A connector adapted for making electrical contact with an electrical assembly for a motor vehicle, wherein:
   the electrical assembly comprises an assembly housing, a circuit board including electrical components and conducting tracks, and first contact elements that are accessible to the connector and that comprise contact surfaces forming edge connectors on a contact area of the circuit board connected with said conducting tracks,
   the assembly housing forms an inner chamber and a contacting chamber,
   the assembly housing comprises an upper housing part, a lower housing part, and upper and lower inner walls respectively provided on the upper and lower housing parts,
   the circuit board is fixed between the upper housing part and the lower housing part,
   the upper and lower inner walls extend to the circuit board, jointly forming an inner wall that separates the contacting chamber from the inner chamber,
   a portion of the circuit board including the electrical components is arranged in the inner chamber and only the contact area of the circuit board protrudes through the inner wall into the contacting chamber,
   the connector comprises a connector housing and second contact elements, which are aligned and shaped in accordance with the first contact elements of the assembly so as to contact the first contact elements, and
   the connector housing is shaped in accordance with the housing of the assembly, so that a moisture-proof assembly-connector unit is obtained when the connector is plugged in.

14. The connector according to claim 13, characterized in that the second contact elements comprise electrically conductive clamping springs which, in a plugged-in state, exert pressure on said contact surfaces of the first contact elements of the circuit board.

15. The connector according to claim 13, further comprising a first contact unit that can be inserted in the connector housing, wherein the first contact unit comprises the second contact elements, affixed to a shared, inner, electrically insulating carrier and wherein at least one of the second contact elements is connected to an electrical connection cable, and a holding means for holding the first contact unit in the connector housing.

16. The connector according to claim 15, characterized in that the first contact unit is exchangeable with a second contact unit that includes third contact elements structurally different from said second contact elements, and that can be inserted in the connector housing instead of the first contact unit including the second contact elements, so that an electrical assembly including corresponding different fourth contact elements can be contacted.

17. The connector according to claim 13, characterized in that a locking device is arranged on the connector housing, by which locking device the connector can be locked to the housing of the electrical assembly, whereby the connector and the housing of the electrical assembly are pressed against each other so as to be moisture-proof in a plugged-in state.

* * * * *